US007749813B2

United States Patent
Kolodin et al.

(10) Patent No.: US 7,749,813 B2
(45) Date of Patent: Jul. 6, 2010

(54) CIRCUIT BOARD FOR DIRECT FLIP CHIP ATTACHMENT

(75) Inventors: Boris Kolodin, Beachwood, OH (US); James Reginelli, Parma, OH (US)

(73) Assignee: Lumination LLC, Cleveland, OH (US)

( * ) Notice: Subject to any disclaimer, the term of this patent is extended or adjusted under 35 U.S.C. 154(b) by 312 days.

(21) Appl. No.: 12/038,200

(22) Filed: Feb. 27, 2008

(65) Prior Publication Data

US 2009/0212317 A1  Aug. 27, 2009

(51) Int. Cl.
H01L 21/00 (2006.01)
H01L 23/12 (2006.01)
H01L 23/053 (2006.01)
H05K 1/00 (2006.01)
H05K 3/02 (2006.01)
H05K 3/10 (2006.01)

(52) U.S. Cl. .............. 438/125; 257/701; 257/E21.596; 257/E23.175; 174/268; 29/846

(58) Field of Classification Search .................. 438/125; 29/846; 174/268; 257/701, E23.596, E23.175
See application file for complete search history.

(56) References Cited

U.S. PATENT DOCUMENTS

| 5,137,618 | A | 8/1992 | Burnett et al. |
| 6,004,619 | A | 12/1999 | Dippon et al. |
| 7,062,354 | B2 | 6/2006 | Ganot et al. |
| 7,179,670 | B2 | 2/2007 | Shelton et al. |
| 7,285,801 | B2 | 10/2007 | Eliashevich et al. |
| 2005/0194605 | A1 | 9/2005 | Shelton et al. |
| 2005/0225973 | A1 | 10/2005 | Eliashevich et al. |
| 2005/0246892 | A1* | 11/2005 | Chen et al. ............. 29/846 |
| 2009/0293268 | A1* | 12/2009 | Carmi ................... 29/825 |

OTHER PUBLICATIONS

"Thermal Substrates: T-Clad," The Bergquist Company, at http://www.bergquistcompany.com/ts_thermal_clad.cfm, 3 pp., 2008.

* cited by examiner

*Primary Examiner*—David A Zarneke
(74) *Attorney, Agent, or Firm*—Fay Sharpe LLP

(57) ABSTRACT

A packaging method comprises: forming a circuit board by forming a substantially continuous conductive layer on an insulating board and removing selected portions of the continuous conductive layer to define an electrically conductive trace; laser cutting the electrically conductive trace to define sub-traces electrically isolated from each other by a laser-cut gap formed by the laser cutting; and bonding a light emitting diode (LED) chip to the circuit board across or adjacent to the laser-cut gap, the bonding including operatively electrically connecting an electrode of the LED chip to one of the sub-traces without using an interposed submount. A semiconductor package comprises an LED chip flip-chip bonded to sub-traces of an electrically conductive trace of a circuit board, the sub-traces being electrically isolated from each other by a narrow gap of less than or about 100 microns.

24 Claims, 5 Drawing Sheets

CIRCUIT BOARD FOR DIRECT FLIP CHIP ATTACHMENT

BACKGROUND

The following relates to the electrical and electronic arts. It finds particular application in semiconductor light emitting device packaging, and will be described with particular reference thereto. The following will find more general application in semiconductor device packaging entailing operative electrical connection of small semiconductor chips or semiconductor chips having small electrode gaps.

Some high power light emitting diode (LED) packages advantageously employ a flip-chip mounting configuration in which the anode and cathode electrodes are disposed on the same side of the chip, and are bonded to mating electrical pads. To reduce resistive losses and promote electrical current spreading, LED chips designed for flip-chip bonding typically include closely spaced, and optionally interleaved, anode and cathode electrodes. For example, the electrodes may be interleaved using an interdigitated finger arrangement, spiral intersections, or so forth. A consequence of this arrangement is that the gap between the mating electrical pads to which the chip is flip-chip bonded should be small. In some configurations, the gap between the mating electrical pads should be about 100 microns or less, and in some more rigorous configurations the gap should be about 80 microns or less.

This presents a problem, because conventional circuit boards have gaps between traces of order 150 microns or larger. Moreover, the minimum gap between traces increases with increasing thickness of the conductive layer. For high power LED packages, it is desirable to have a circuit board with a relatively thick conductive layer so as to promote heat sinking of the high power LED chip into the circuit board through the flip chip bonding connection.

It is known in the art to use a submount to accommodate the small electrode spacing of the LED chip to the wider-spaced electrical pads of the circuit board. Typically, a submount of silicon or other thermally conductive material is interposed between the LED chip and the circuit board. The submount has finely spaced electrical pads to which the LED chip is flip-chip bonded, and the submount in turn is electrically and mechanically attached to the circuit board in a suitable fashion that entails larger tolerances comporting with the wider spacing of the circuit board traces.

Submounts have certain disadvantages, however, including for example increased packaging complexity and concomitant yield reduction, introduction of additional thermal resistance due to the intervening submount, and possible incompatibilities between the submount material and processing operations performed after chip attachment to the submount.

Shelton et al., U.S. Publ. Appl. No. 2005/0194605 A1 published Sep. 8, 2005 discloses another approach for addressing this problem, in which one or more fanning layers are formed on the front-side of the LED chip. Each fanning layer includes a dielectric layer and one or more metal layers, and the topmost fanning layer defines electrical contact pads spaced apart widely enough to enable direct flip-chip bonding of the chip including the fanning layers to the circuit board. This approach is not readily applied to packaging of commercially available diced LED chips that do not include the aforementioned fanning layer or fanning layers.

BRIEF SUMMARY

In accordance with certain illustrative embodiments shown and described as examples herein, a packaging method is disclosed, comprising: forming a circuit board by forming a substantially continuous conductive layer on an insulating board and removing selected portions of the continuous conductive layer to define an electrically conductive trace; laser cutting the electrically conductive trace to define sub-traces electrically isolated from each other by a laser-cut gap formed by the laser cutting; and bonding a light emitting diode (LED) chip to the circuit board across or adjacent to the laser-cut gap, the bonding including operatively electrically connecting an electrode of the LED chip to one of the sub-traces without using an interposed submount.

In accordance with certain illustrative embodiments shown and described as examples herein, a method is disclosed for bonding a semiconductor chip to a circuit board, the method comprising: laser cutting a conductive trace of the circuit board to define sub-traces electrically isolated from each other by a laser-cut gap formed by the laser cutting; and bonding the semiconductor chip to the circuit board across or adjacent to the laser-cut gap, the bonding including operatively electrically connecting the semiconductor chip with at least one of the sub-traces.

In accordance with certain illustrative embodiments shown and described as examples herein, a semiconductor package is disclosed comprising a semiconductor chip and a circuit board, wherein the semiconductor chip is bonded to the circuit board by a process as set forth in the immediately preceding paragraph, the semiconductor package not including a submount interposed between the semiconductor chip and the circuit board.

In accordance with certain illustrative embodiments shown and described as examples herein, a semiconductor package is disclosed, comprising: a light emitting diode (LED) chip; and a circuit board on which the LED chip is attached by a flip chip bond including operative electrical connections of n and p electrodes of the LED chip to respective sub-traces of an electrically conductive trace of the circuit board, the sub-traces being electrically isolated from each other by a narrow gap of less than or about 100 microns.

Numerous advantages and benefits of the present invention will become apparent to those of ordinary skill in the art upon reading and understanding the present specification.

BRIEF DESCRIPTION OF THE DRAWINGS

The invention may take form in various components and arrangements of components, and in various process operations and arrangements of process operations. The drawings are only for purposes of illustrating preferred embodiments and are not to be construed as limiting the invention.

FIG. 8 shows the final LED chip package including the solder mask.

DETAILED DESCRIPTION OF PREFERRED EMBODIMENTS

Figure 1:
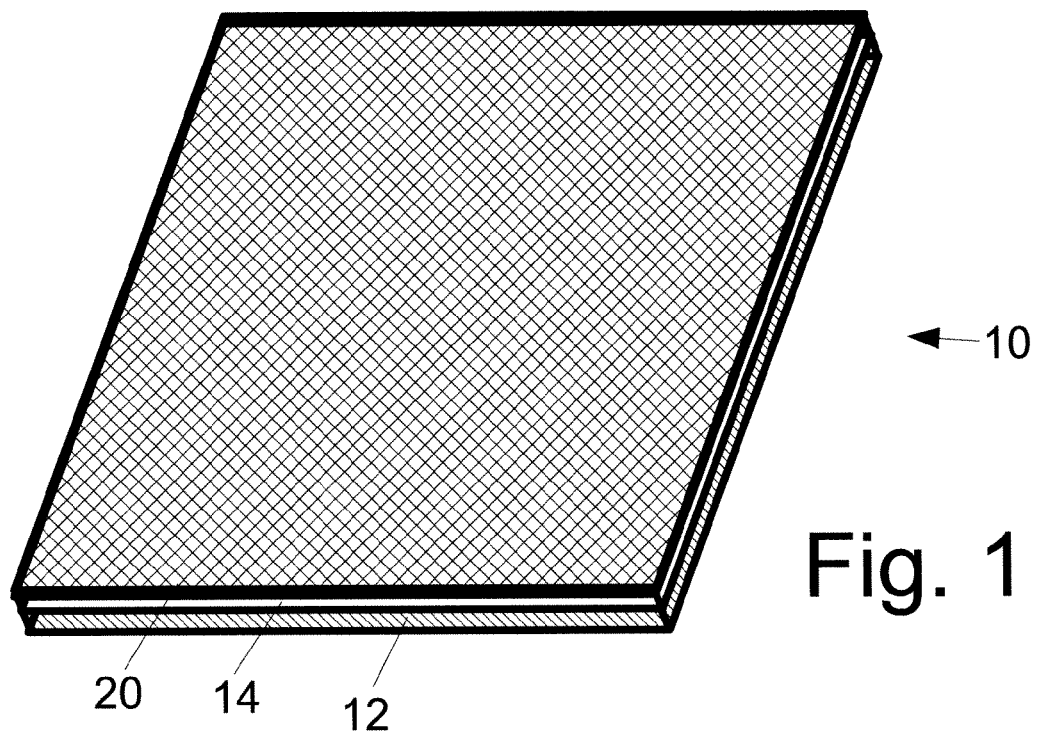
FIGS. 1 and 2 diagrammatically show perspective and top views of an illustrative metal core printed circuit board.
Figure 2:
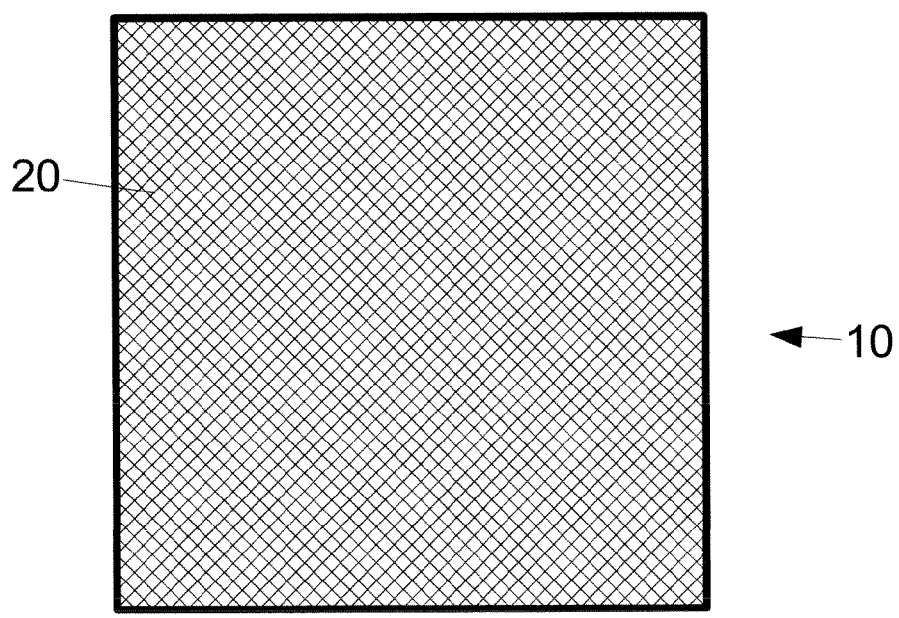

FIGS. 1 and 2 show perspective and top views of a circuit board 10 which includes a relatively thick metal substrate 12 on which is disposed a relatively thin electrically insulating layer 14, on top of which is disposed an electrically conductive layer 20 made of copper, a copper alloy, or another suitable electrically conductive material. The electrically conductive layer 20 is intended to be patterned by spatially selective removal to define electrically conductive circuitry for interconnecting one or more electronic components to be mounted on the circuit board 10.

The circuit board 10 is of the type sometimes referred to as a metal core printed circuit board, where the term "metal core" refers to the relatively thick metal substrate 12. In such circuit boards, the metal core 12 is intended to provide both mechanical support and also thermal heat spreading or heat sinking. The electrically insulating layer 14 is relatively thin in order to provide good thermal transfer from the electronic components and the electrically conductive layer 20 to the metal core 12. Some suitable metal core printed circuit boards are available, for example, from The Bergquist Company, Chanhassen, Minn., under the name "T-clad" thermal clad boards, which use a metal such as aluminum or copper as the metal core 12, a dielectric layer as the electrically insulating layer 14, and a copper layer of thickness 35-350 microns for the electrically conductive layer 20. Although metal clad printed circuit boards are used as illustrative examples herein, it is to be appreciated that the packaging techniques disclosed herein can be performed in conjunction with other types of circuit boards, including boards that do not have a metal core.

Figure 3:
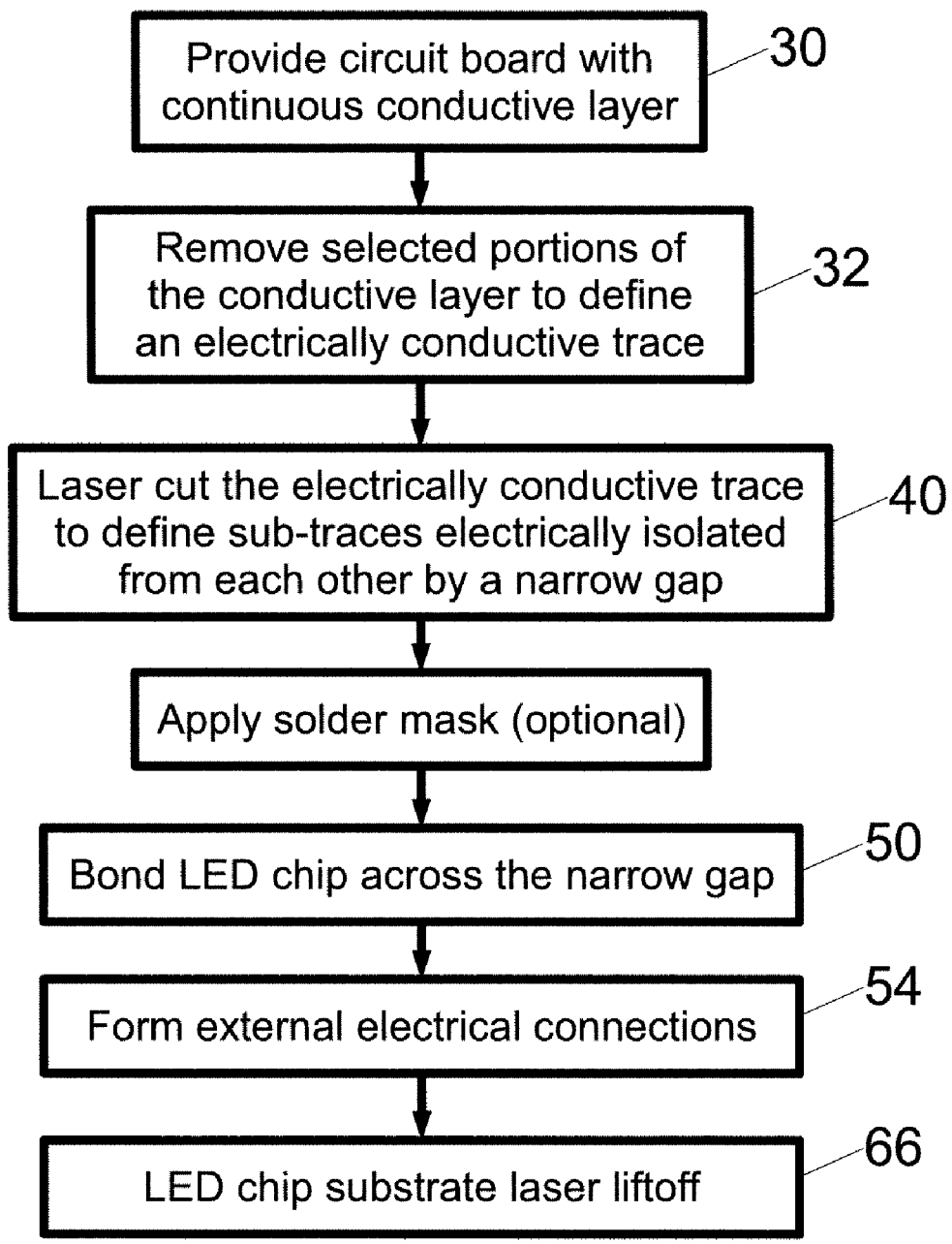
FIG. 3 shows an LED chip packaging process flow diagram.

With reference to FIGS. 3-6, an illustrative packaging method is disclosed for constructing a light emitting package using the circuit board 10 and one or more light emitting diode (LED) chips. While the packaging techniques disclosed herein can be used to package one, two, three, four, five, or more LED chips, the illustrative example of FIGS. 3-6 describes packaging of four LED chips on the circuit board 10 as an illustrative example. FIG. 3 shows a process flow chart having as a first operation 30 the providing of a circuit board such as the illustrative metal core circuit board 10. The packaging entails patterning the electrically conductive layer 20 to define circuitry to which LED chips are mechanically and electrically connected.

Figure 4:
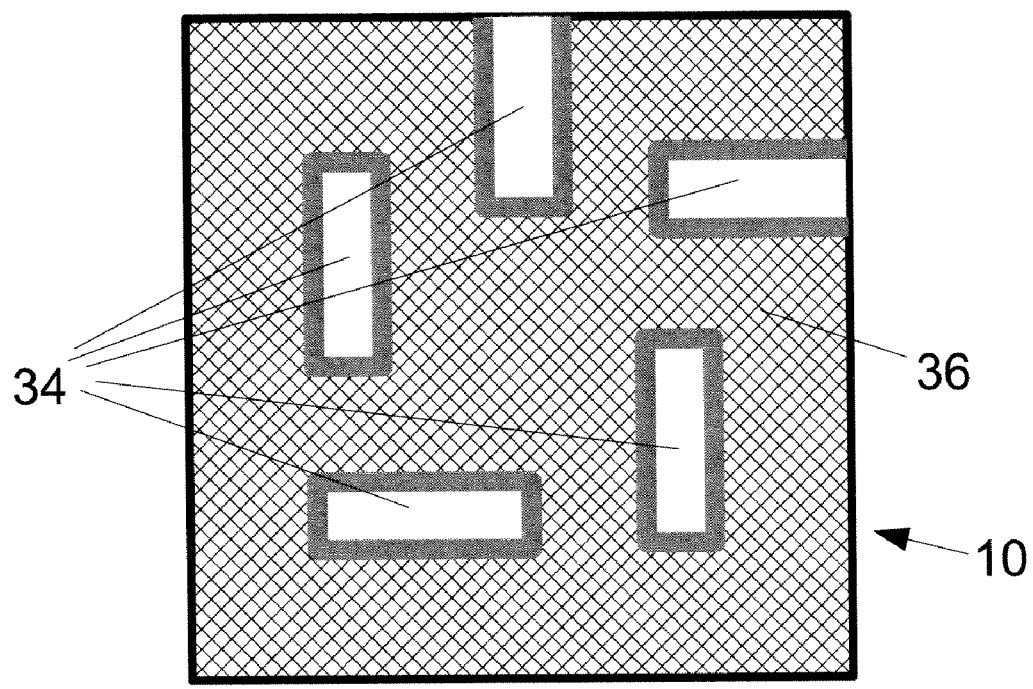
FIGS. 4-6 show an illustrative LED chip package at various stages in the fabrication process, with FIG. 6 showing the final LED chip package.

With reference to FIGS. 3 and 4, a first patterning operation 32 entails removing selected portions 34 of the electrically conductive layer 20 to define an electrically conductive trace 36. In the illustrative example of FIG. 4, the electrically conductive trace 36 is electrically contiguous and occupies most of the area of the circuit board 10, except for those selected removed portions 34. In other embodiments, the first patterning operation may produce a plurality of electrically conductive traces that are electrically isolated from one another by the selectively removed portions.

The first patterning operation 32 uses a patterning technique such as photolithographic wet chemical etching, in which a photoresist layer is applied to the entire surface of the electrically conductive layer 20. The photoresist layer is exposed to light using a photomask so as to photochemically alter selected portions of the photoresist layer. A developer, such as a suitable solvent, is then applied to remove either the original photoresist or the photochemically altered photoresist.

If a positive photoresist is used, then light exposure makes the positive photoresist soluble in the developer. Accordingly, when using a positive photoresist the photomask exposes to light the areas 34 from which the electrically conductive layer 20 is to be selectively removed. On the other hand, if a negative photoresist is used, then light exposure hardens the negative photoresist so that the light-exposed areas become insoluble in the developer. Accordingly, when using a negative photoresist the photomask exposes to light the entire area except for the areas 34 from which the electrically conductive layer 20 is to be selectively removed. Moreover, as is known in the art some photolithography processes include additional operations such as one or more curing steps that cure the photoresist layer.

After development and optional post-development curing, the photoresist covers the entire area except for the areas 34 from which the electrically conductive layer 20 is to be selectively removed. A suitable wet chemical etchant is then applied. The wet chemical etchant is selected to etch or remove the material of the electrically conductive layer, but to not remove the photoresist. Accordingly, the wet chemical etching removes the portions of the electrically conductive layer 20 in the "windows" of the photoresist which correspond to the areas 34. The photoresist is then removed using a suitable solvent, leaving the configuration shown in FIG. 4.

Photolithographic wet chemical etching is a relatively fast process, and moreover the processing time for the first patterning operation 32 is advantageously independent of the total area or size of the areas 34 from which the electrically conductive layer 20 is selectively removed. However, the first patterning operation 30 produces openings 34 in the electrically conductive layer 20 which have imprecise edges. This is diagrammatically indicated in FIG. 4 by the use of thick grayed lines in representing the edges of the removed areas 34. The imprecision or fuzziness of these edges is a function of the thickness of the electrically conductive layer, the chemistry, etch time, and other parameters of the wet chemical etching, the sharpness of the optical edges produced by the photomask and light exposure system, optical and chemical characteristics of the photoresist, and so forth. Typically, the edges of the areas 34 have nonvertical edges due to undercutting during the wet chemical etching, and these nonvertical edges contribute to the fuzziness or imprecision of the edges of the areas 34.

As a consequence of such factors, there is a minimum gap that can be formed by photolithographic wet chemical etching. This minimum gap increases with increasing thickness of the electrically conductive layer 20. For example, The Bergquist Company specifies a minimum gap space that can be defined as a function of thickness of the electrically conductive layer: the specified minimum gap space is 180 microns for a 35 micron thick electrically conductive layer; 230 microns for a 70 micron thick electrically conductive layer; 300 microns for a 105 micron thick electrically conductive layer; 360 microns for a 140 micron thick electrically conductive layer; 510 microns for a 210 micron thick electrically conductive layer; and so forth.

For packaging of LED chips, these large minimum gap values are problematic. For flip chip bonding of an LED chip, for example, the gap between p-type and n-type electrodes on the chip is typically about 80 microns. Larger gaps between the electrodes are disadvantageous as they introduce higher lateral current flow and correspondingly higher resistive losses and resistive heating in the LED chips. This small electrode spacing cannot be accommodated even by the 180 micron minimum gap space specified by Bergquist for a T-clad thermal clad board with a 35 micron electrically conductive layer. Moreover, it is advantageous, preferable, or required to use a circuit board with a thicker electrically conductive layer in order to carry the relatively high LED chip drive current which is typically a few hundred milliamperes or higher for typical high power LED chips. In some embodiments, the electrically conductive layer 20 has a thickness of about 100 microns or greater. These thicker electrically conductive layers have correspondingly higher minimum gap spaces.

In view of the aforementioned difficulties, it is known to interpose a submount between the LED chip and the circuit board. The term "submount" as used herein is intended to denote a structure of silicon or another material having a set of bonding pads configured to connect with electrodes of the LED chip and another set of bonding pads configured to connect directly or by wire bonding to the circuit board. In accordance with its usual use in the art, the term "submount" does not encompass solder material, bonding bumps, or other electrically conductive material used to effectuate operative electrical connection between the electrodes of the LED chip and the traces (or sub-traces) of the circuit board.

The illustrative packaging of FIGS. 3-6, however, does not utilize a submount. Rather, the LED chips are flip-chip bonded directly (that is, without a submount) to the circuit board 10. For example, the LED chips may be directly flip-chip bonded to the circuit board 10 without an interposed submount using gold bumps disposed on the circuit board traces and/or on the LED electrodes, in conjunction with solder bonding, ultrasonic bonding, thermosonic bonding, thermocompressive bonding, or so forth. To achieve direct bonding, the first patterning operation 32 substantially defines the electrical circuitry of the package, but does not define the gaps across which LED chips are bonded.

Figure 5:
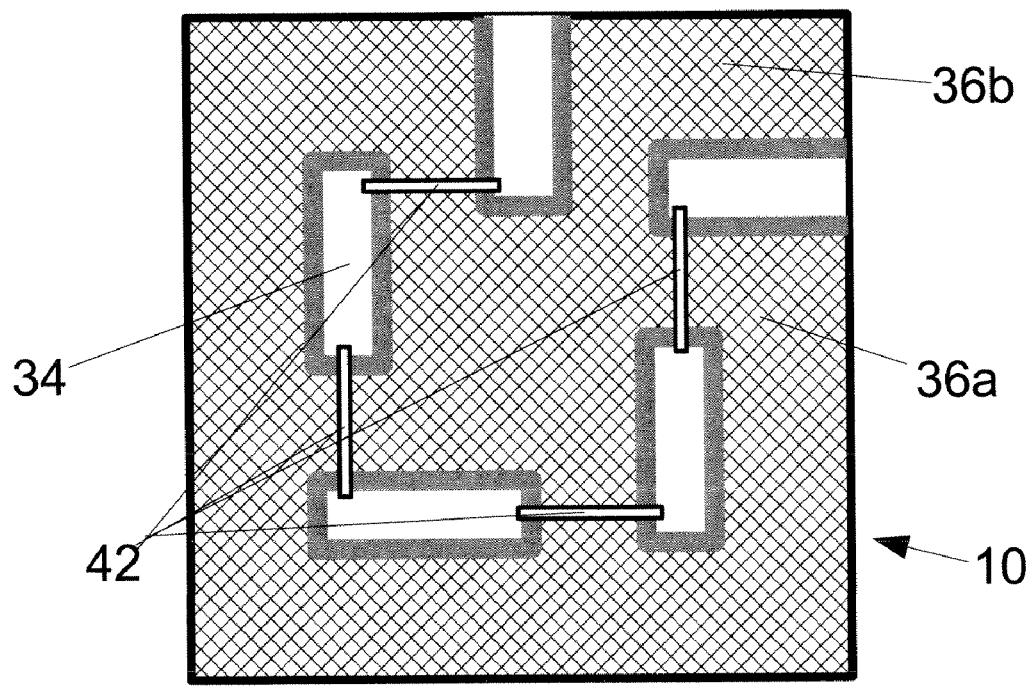

With continuing reference to FIG. 3 and with further reference to FIG. 5, a second patterning operation 40 entails laser cutting the electrically conductive trace 36 (shown in FIG. 4) to define sub-traces 36a, 36b electrically isolated from each other by a narrow laser-cut gap or plurality of narrow laser-cut gaps 42 formed by the laser cutting. Unlike wet chemical etching, laser cutting can produce substantially smaller gap spaces in the electrically conductive layer which are sufficiently small to accommodate the small (e.g., ~80 micron or less) electrodes spacing of a typical LED chip designed for flip-chip mounting. In illustrative FIG. 5, the gaps 42 are diagrammatically drawn with narrow dark edge lines as compared with the thick grayed lines used to represent edges formed by the first patterning operation 32, so as to diagrammatically indicate the sharper edges formed by the laser cutting. In some embodiments, the first patterning operation 32 removes selected portions of the continuous conductive layer 20 by a process other than laser cutting to define one or more gaps 34 of greater than or about 150 microns in width, and the laser cutting operation 40 defines sub-traces 36a, 36b electrically isolated from each other by a narrow gap or gaps which is or are less than or about 100 microns wide.

In illustrative FIG. 5, a single electrically contiguous trace 36 is divided into two sub-traces 36a, 36b by four narrow gaps 42 formed by laser cutting. More generally, a single electrically contiguous trace can be divided by laser cutting into three or more sub-traces, or two or more electrically contiguous traces can be divided into by laser cutting into three or more sub-traces. For example, the removing 32 of selected portions of the continuous electrically conductive layer 20 by a process other than laser cutting may define a plurality of electrically conductive traces electrically isolated from one another by one or more gaps of greater than or about 150 microns, and the laser cutting 40 may define sub-traces electrically isolated from each other by one or more narrow gaps which is or are less than or about 100 microns wide. At least one laser cut is required to divide any given electrically contiguous trace into at least two sub-traces. Each narrow gap 42 formed by laser cutting should pass at least completely through the electrically conductive layer 20 in order to provide electrical isolation across the gap. Optionally, the narrow gaps 42 formed by laser cutting may cut into the electrically insulating layer 14 or even into the metal core 12, although in the latter case care should be taken that an electrical short between the electrically conductive layer 20 and the metal core is not generated.

Laser cutting is typically a slower process than photolithographic wet chemical etching, because the laser beam is moved continuously or stepwise along each cut to be formed with dwell times long enough to produce thermal evaporation or ablation of the material to be removed by laser cutting. Moreover, for typical electrically conductive layer thicknesses of 30 microns or greater the laser cutting utilizes multiple passes to avoid excessive heating during the laser cutting of the thick layer. The time for the second patterning operation 40 is also dependent upon the amount of material to be removed by the laser cutting, whereas the wet chemical etching time is independent of the area to be etched.

However, it is recognized herein that the processing time disadvantage of using laser cutting can be mitigated by limiting the laser cutting to those gaps of the pattern which must be made small or which must have precise edges. For LED chip packaging, such gaps include those gaps across which LED chips are bonded, or gaps that are adjacent or neighboring a bond to an LED chip. In other words, the processing time and gap precision is optimized in the packaging techniques disclosed herein by using a selected combination of (i) generally faster wet chemical etching to form most of the circuitry pattern and (ii) generally slower laser cutting to form the precision regions of the circuitry pattern.

Figure 6:
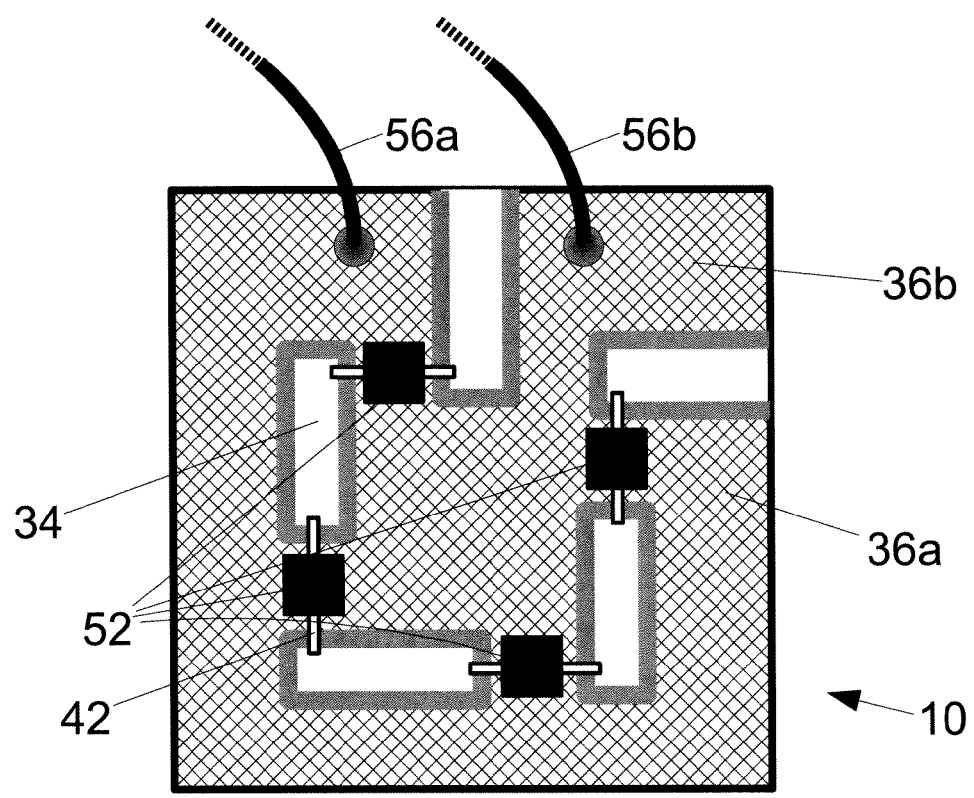

With continuing reference to FIG. 2 and with further reference to FIG. 6, the circuitry pattern is formed by the first and second patterning operations 32, 40. Although termed "first" and "second" patterning operations herein, it is to be appreciated that the order of performance of these operations can be reversed, that is, the laser cutting operation 40 can be performed first to form the narrow gap or gaps 42 followed by the photolithographic wet chemical etching operation 32. After the patterning operations 32, 40 are complete, in a bonding operation 50 one or more LED chips are bonded to the circuit board 10 across or adjacent to one or more of the narrow gaps 42 formed by laser cutting. In the illustrative embodiment of FIG. 6, four LED chips 52 are flip-chip bonded across the corresponding four narrow gaps 42 formed by laser cutting. The flip chip bonding is such that the p-electrodes of the LED chips 52 are electrically connected with one of the sub-traces 36a, 36b and the n-electrodes of the LED chips 52 are electrically connected with the other of the sub-traces 36a, 36b. Suitable bonding mechanisms for the flip-chip bonding include soldering, thermosonic bonding, thermocompressive bonding, or so forth. One or more bonding bumps made of one or more materials, such as gold stud bumps, gold-coated copper bumps, solder bumps, or so forth, may be disposed on either the sub-traces 36a, 36b, the electrodes of the LED chips 52, or both, in order to facilitate the bonding. In an external electrical connection operation 54, a wire bond 56a or other external electrical connection is made to the sub-trace 36a and another wire bond 56b or other external electrical connection is made to the sub-trace 36b. Thus, in the illustrated embodiment the four LED chips 52 are electrically connected in parallel across the sub-traces 36a, 36b, or equivalently are electrically connected in parallel across the external electrical connections 56a, 56b. The bonding operations 50, 54 can be performed in either order; moreover, if the same bonding technology is used for both bonding operations 50, 54 these operations may be performed concurrently.

Although not illustrated, the skilled artisan can readily design other electrical patterns using the patterning operations 32, 40, such as serially interconnected LED chips, or more complex circuits such as one or more LED chips connected in series with a current limiting resistor and/or in parallel with an electrostatic discharge protection device. In each case, the first patterning operation 32 is used for most of the patterning while the laser cutting patterning operation 40 is used to perform pattern regions requiring precise edges, narrow gaps, or both. The approach is useful for direct flip-chip bonding of LED chips to circuit boards, where the gap across which the flip-chip bonding is performed is generated by the laser cutting patterning operation 40. The approach is also useful for other types of LED chip bonding such as direct bonding of one electrode of a vertical LED chip to the circuit board with the second electrode of the vertical LED chip (located on the opposite side of the chip for a vertical LED chip) is connected by wire bonding. In such a configuration, the direct-bonded vertical LED chips can be packed closely together by using the laser cutting patterning operation 40 to form the isolation gaps between the closely packed vertical LED chips.

Figure 7:
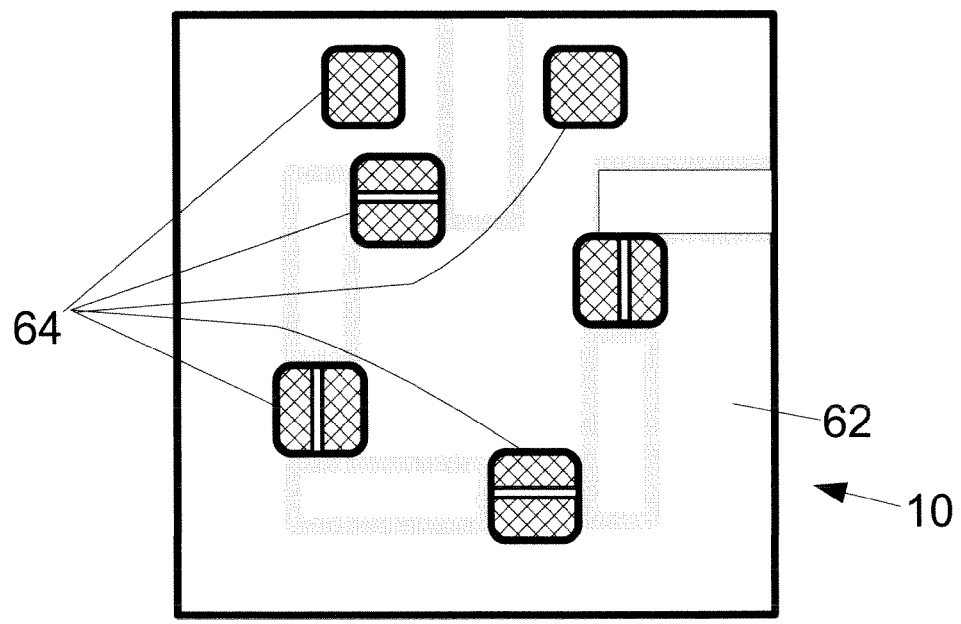
FIGS. 7 and 8 show a modification of the LED chip packaging process of FIGS. 4-6 which includes an additional solder mask application operations.
Figure 8:
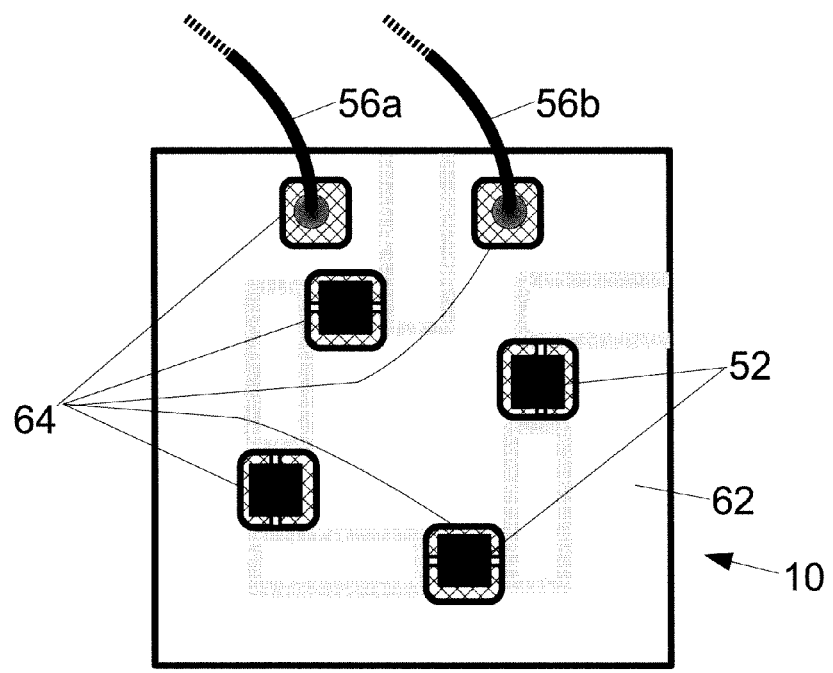

With continuing reference to FIG. 2 and with further reference to FIGS. 7 and 8, in an alternative embodiment an additional solder mask application operation 60 is performed after the circuit patterning operations 32, 40 but before the bonding operations 50, 54. As shown in FIG. 7, a solder mask 62 is applied to cover most of the surface of the circuit board 10, leaving openings 64 for bonding the LED chips 52 and the external electrical connections 56a, 56b. The solder mask 62 can be applied in any suitable fashion. In some embodiments, the solder mask is cut to form the openings 64 and then the solder mask with the openings 64 formed is attached to the circuit board 10 by using an adhesive or the like. Alternatively, the solder mask can be attached to the circuit board 10 first, and then cut to form the openings 64. FIG. 8 shows the package of FIG. 7 with the solder mask 62 and after the bonding operations 50, 54 have attached the LED chips 52 and wire bonds 56a, 56b.

With reference back to FIG. 2, in another variation the LED chip packaging includes a substrate laser lift-off operation 66. Although shown in FIG. 2 as being performed after the external electrical connection operation 54, it is also contemplated to perform the substrate laser lift-off operation 66 before the external electrical connection operation 54. The substrate laser lift-off operation 66 is an optional operation performed to remove the substrate of a flip-chip bonded LED chip. For example, a sapphire substrate of a gallium nitride (GaN)-based LED chip may be removed by applying a suitable laser beam through the sapphire substrate, such that the laser beam energy is absorbed at or near a sapphire/group III-nitride interface. Laser liftoff can also be used in conjunction with other LED chips, such as GaN-based LED chips formed on a silicon carbide (SiC) substrate, gallium arsenide (GaAs)-based LED chips, and so forth. In some embodiments, laser liftoff is facilitated by another operation such as application of a chemical that enhances delamination, application of sonic energy, or so forth, or liftoff is achieved by another means such as chemical etching of a sacrificial layer disposed between the LED chip substrate and the active layers of the LED chip. In some embodiments, potassium hydroxide (KOH) or another chemical is applied to clean the LED chip surface exposed by the substrate laser liftoff or other substrate removal. In these embodiments, the use of direct LED chip bonding without a sub-mount in accordance with the LED chip packaging techniques disclosed herein is advantageous, because typical sub-mount materials such as silicon are incompatible with KOH.

Figure 9:
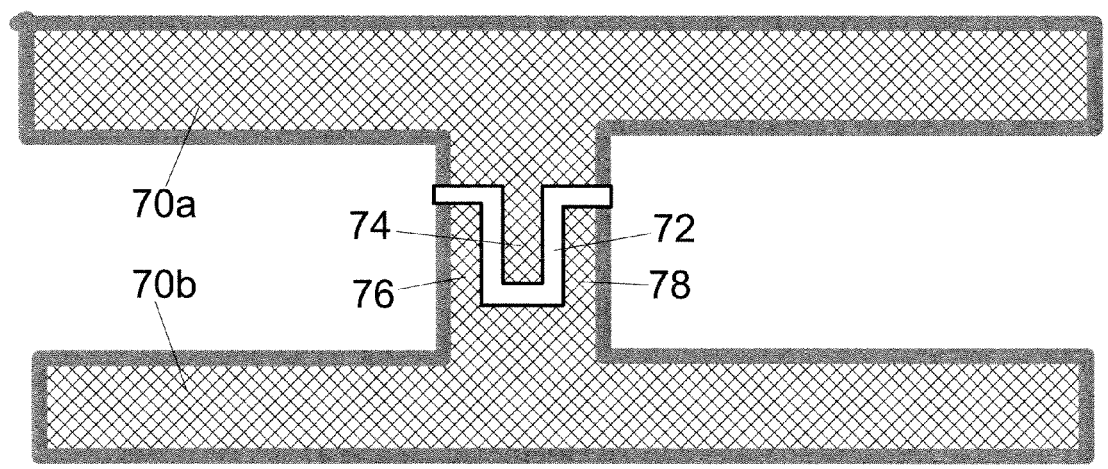
FIG. 9 shows an illustrative trace divided into sub-traces by a narrow nonlinear gap formed by laser cutting.

With reference to FIG. 9, the narrow gaps formed by laser cutting can be curved, bent, or otherwise nonlinear. FIG. 9 shows a trace 70 formed by the first patterning operation 32 and hence having fuzzy or imprecise edges represented in FIG. 9 by thick grayed lines. The trace 70 is divided into sub-traces 70a, 70b that are electrically isolated from each other by a narrow gap 72 formed by laser cutting and hence having precise edge lines represented by narrow dark edge lines. The illustrative narrow gap 72 is "U" shaped to define a central bonding area 74 electrically continuous with and part of the sub-trace 70a and two peripheral bonding areas 76, 78 electrically continuous with and part of the sub-trace 70b. Such a configuration is suitable, for example, to accommodate bonding with an LED chip configured for flip-chip bonding and having an interdigitated chip electrode pattern with three interdigitated fingers of electrode type n/p/n or of electrode type p/n/p. Other interdigitated, spiral, or otherwise intermingled electrode patterns can similarly be accommodated by one or more suitably shaped narrow gaps formed by laser cutting. By such accommodation, direct flip-chip bonding of these LED chips with intermingled electrode patterns is readily achieved. Advantageously, most laser cutting machines include a programmable x-y translation stage for programmed x-y movement of the laser, the specimen being cut, or both. Thus, it is straightforward to program the laser cutting machine to form complex nonlinear narrow gaps such as the illustrative "U" shaped narrow gap 72. Direct flip-chip bonding eliminates the interposed sub-mount. This, in turn, simplifies manufacturing, reduces manufacturing cost, and improves device performance by improved direct thermal coupling between the LED chips 52 and the circuit board 10.

In FIG. 2 the solder mask application operation 60 is shown as being performed after both patterning operations 32, 40. However, it is also contemplated to perform the solder mask application operation before the laser cutting patterning operation. In such a manufacturing sequence, the laser cutting suitably cuts through the solder mask as well as through the electrically conductive layer 20. Alternatively, in such a manufacturing sequence the solder mask can have gaps sized to accommodate the narrow gaps 40 formed by the laser cutting.

Although described with reference to LED chip packaging, it will be appreciated that the packaging techniques disclosed herein employing a combination of the first and second patterning operations 32, 40 will find more general application in the packaging of semiconductor chips in general.

The preferred embodiments have been illustrated and described. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A packaging method comprising:
   forming a circuit board by forming a substantially continuous conductive layer on an insulating board and removing selected portions of the continuous conductive layer to define an electrically conductive trace;

laser cutting the electrically conductive trace to define sub-traces electrically isolated from each other by a laser-cut gap; and bonding a light emitting diode (LED) chip to the circuit board across or adjacent to the laser-cut gap, the bonding including operatively electrically connecting an electrode of the LED chip to one of the sub-traces without using an interposed submount.

2. The packaging method as set forth in claim 1, wherein the removing of selected portions of the continuous conductive layer to define the electrically conductive trace is performed by a process other than laser cutting.

3. The packaging method as set forth in claim 1, wherein the bonding comprises:

flip-chip bonding the LED chip across the laser-cut gap with anode and cathode electrodes of the LED chip operatively electrically connected to different ones of the sub-traces that are electrically isolated from each other by the laser-cut gap formed by the laser cutting, there being no submount interposed between the LED chip and the circuit board.

4. The packaging method as set forth in claim 3, wherein the removing of selected portions of the continuous conductive layer to define the electrically conductive trace defines one or more gaps of greater than or about 150 microns, and the laser cutting defines sub-traces electrically isolated from each other by the laser-cut gap which is less than or about 100 microns.

5. The packaging method as set forth in claim 4, wherein the laser cutting defines sub-traces electrically isolated from each other by the laser-cut gap which is less than or about 80 microns.

6. The packaging method as set forth in claim 1, wherein the substantially continuous conductive layer formed on the insulating board has a thickness that is greater than or about 30 microns.

7. The packaging method as set forth in claim 6, wherein the removing of selected portions of the continuous conductive layer to define the electrically conductive trace comprises:

removing the selected portions of the continuous conductive layer by a wet chemical etching process.

8. The packaging method as set forth in claim 1, wherein the operative electrically connecting of an electrode of the LED chip to one of the sub-traces without using an interposed submount comprises:

electrically connecting the electrode to the sub-trace via a bonding bump by soldering, thermosonic bonding, or thermocompressive bonding.

9. A method for bonding a semiconductor chip to a circuit board, the method comprising:

laser cutting a conductive trace of the circuit board to define sub-traces electrically isolated from each other by a laser-cut gap formed by the laser cutting; and bonding the semiconductor chip to the circuit board across or adjacent to the laser-cut gap, the bonding including operatively electrically connecting the semiconductor chip with at least one of the sub-traces.

10. The method as set forth in claim 9, wherein prior to the laser cutting the circuit board includes one or more gaps of greater than or about 150 microns in an electrically conductive layer defining the conductive trace, and the laser-cut gap formed by the laser cutting is less than or about 100 microns.

11. The method as set forth in claim 10, wherein the semiconductor chip is a light emitting diode (LED) chip, and the bonding comprises:

flip-chip bonding the LED chip across the laser-cut gap, the flip-chip bonding including operatively electrically connecting anode and cathode electrodes of the LED chip to respective sub-traces electrically isolated from each other by the laser-cut gap.

12. The method as set forth in claim 11, wherein the anode and cathode electrodes of the LED chip have a minimum spacing of less than or about 100 microns, and the laser-cut gap formed by the laser cutting is less than or about 80 microns.

13. The method as set forth in claim 11, wherein the laser cutting operation is performed on a conductive trace of the circuit board having a thickness that is greater than or about 30 microns.

14. The method as set forth in claim 10, wherein the bonding does not include interposing a submount between the semiconductor chip and the circuit board.

15. The method as set forth in claim 9, wherein the semiconductor chip is a light emitting diode (LED) chip, and the bonding comprises:

flip-chip bonding the LED chip across the laser-cut gap, the flip-chip bonding including operatively electrically connecting p and n electrodes of the LED chip to respective sub-traces electrically isolated from each other by the laser-cut gap.

16. The method as set forth in claim 15, wherein the bonding operation does not include interposing a submount between the LED chip and the sub-traces.

17. The packaging method as set forth in claim 16, wherein the bonding operation comprises:

operatively electrically connecting p and n electrodes of the LED chip to respective sub-traces electrically isolated from each other by the laser-cut gap via bonding bumps by soldering, thermosonic bonding, or thermocompressive bonding.

18. The method as set forth in claim 15, further comprising:

forming the circuit board by a process comprising:

forming a substantially continuous conductive layer on an insulating board, and removing selected portions of the continuous conductive layer by wet chemical etching to define the conductive trace on which the laser cutting operation is performed.

19. The method as set forth in claim 9, further comprising:

forming the circuit board by a process comprising:

forming a substantially continuous conductive layer on an insulating board, and removing selected portions of the continuous conductive layer by a process other than laser cutting to define the conductive trace on which the laser cutting operation is performed.

20. A semiconductor package comprising a semiconductor chip and a circuit board, wherein the semiconductor chip is bonded to the circuit board by a process as set forth in claim 9, the semiconductor package not including a submount interposed between the semiconductor chip and the circuit board.

21. A semiconductor package comprising:

a light emitting diode (LED) chip; and a circuit board on which the LED chip is attached by a flip-chip bond including operative electrical connections of n and p electrodes of the LED chip to respective sub-traces of an electrically conductive trace of the circuit board, the sub-traces being electrically isolated from each other by a narrow gap of less than or about 100 microns.

22. The semiconductor package as set forth in claim 21, wherein the sub-traces are electrically isolated from each other by a narrow gap of less than or about 80 microns.

23. The semiconductor package as set forth in claim 21, wherein the electrically conductive trace of the circuit board has a thickness that is greater than or about 30 microns.

24. The semiconductor package as set forth in claim 21, wherein the semiconductor package does not include a sub-mount interposed between the LED chip and the circuit board.

* * * * *